(12) United States Patent
Tokukura

(10) Patent No.: US 7,926,153 B2
(45) Date of Patent: Apr. 19, 2011

(54) METHOD FOR PRODUCTION OF LIQUID EJECTING HEAD UNIT

(75) Inventor: Takashi Tokukura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 795 days.

(21) Appl. No.: 11/935,920

(22) Filed: Nov. 6, 2007

(65) Prior Publication Data

US 2008/0178443 A1 Jul. 31, 2008

(30) Foreign Application Priority Data

Nov. 7, 2006 (JP) ................................. 2006-302086

(51) Int. Cl.
*H04R 17/00* (2006.01)
(52) U.S. Cl. ..................................... 29/25.35; 29/890.1
(58) Field of Classification Search ................. 29/25.35, 29/890.1; 324/207.11, 222, 223, 244, 457, 324/458; 347/2
See application file for complete search history.

(56) References Cited

U.S. PATENT DOCUMENTS

2006/0090337 A1* 5/2006 Yasui ........................... 29/890.1

FOREIGN PATENT DOCUMENTS

| JP | 2001-162811 | 6/2001 |
| JP | 2003-243741 | 8/2003 |

* cited by examiner

*Primary Examiner* — Derris H Banks
*Assistant Examiner* — Azm Parvez
(74) *Attorney, Agent, or Firm* — Workman Nydegger

(57) ABSTRACT

The invention provides a method of producing a liquid ejecting head unit that has a plurality of liquid ejecting heads combined with one another. Each of the plurality of liquid ejecting heads has a fluid channel formation substrate, which has pressure generation chambers that are in communication with nozzle orifices through which liquid is ejected, and piezoelectric elements, each of which is made up of a lower electrode, a piezoelectric layer that has hysteresis characteristic in a polarization electric field, and an upper electrode, formed on the fluid channel formation substrate with a vibrating plate being interposed therebetween. The liquid ejecting head unit production method according to an aspect of the invention includes: acquiring coercive electric fields of the piezoelectric layers of the liquid ejecting heads; classifying the liquid ejecting heads into ranks on the basis of the acquired coercive electric fields; and combining the liquid ejecting heads that belong to the same rank together.

4 Claims, 7 Drawing Sheets

METHOD FOR PRODUCTION OF LIQUID EJECTING HEAD UNIT

The entire disclosure of Japanese Patent Application No. 2006-302086, filed Nov. 7, 2006 is expressly incorporated by reference herein

BACKGROUND

1. Technical Field

The present invention generally relates to a method of producing a liquid ejecting head unit that has a plurality of liquid ejecting heads combined with one another. Each of the plurality of liquid ejecting heads to which the invention is directed is provided with a fluid channel formation substrate, which has pressure generation chambers that are in communication with nozzle orifices through which liquid is ejected, and piezoelectric elements, each of which is made up of a lower electrode, a piezoelectric layer, and an upper electrode, formed on one surface of the fluid channel formation substrate. More particularly, the invention relates to a method of producing an ink-jet recording head unit that has a plurality of ink-jet recording heads combined with one another, where the ink-jet recording heads discharge ink as an example of a variety of liquid.

2. Related Art

As a known configuration of an ink-jet recording head unit (hereafter referred to as a head unit) that is provided with a plurality of ink-jet recording heads, a head unit of related art is provided with a plurality of ink-jet recording heads that discharge ink supplied from ink cartridges or the like through nozzle orifices, head cases that are bonded to one surface of the ink-jet recording heads that is opposite to the ink-discharging surface thereof, and a cartridge case which supports the plurality of the ink-jet recording heads and the head cases. A typical example of such a known configuration is described in JP-A-2001-162811 (specifically, refer to FIG. 2 thereof).

A typical ink-jet recording head is provided with a fluid channel formation substrate, which has pressure generation chambers that are in communication with nozzle orifices from which ink is discharged. Such a typical ink-jet recording head is further provided with piezoelectric elements that are made up of a lower electrode, a piezoelectric layer, and an upper electrode, where the piezoelectric elements are formed on one surface of the fluid channel formation substrate with a vibrating plate being interposed therebetween. When a voltage is applied between the upper electrode and the lower electrode of the piezoelectric element, the piezoelectric layer gets deformed. As the piezoelectric layer becomes deflected, a pressure change occurs inside the pressure generation chamber; and as a result thereof, ink is discharged from the nozzle orifice.

It is known in the art that the piezoelectric layer of the piezoelectric element used in such an ink-jet recording head is made of dielectric material, and has hysteresis characteristic in a polarization electric field.

A related art disclosed in JP-A-2003-243741 (specifically, refer to Pages 5 and 7 as well as FIGS. 1 and 6 thereof) proposes the application of a voltage to a piezoelectric layer having two coercive electric fields located in the same electric-field polarity, where the voltage provides an electric-field intensity that is not less than the coercive electric fields.

However, the coercive electric fields of the piezoelectric layers vary from one to another. Therefore, if an ink-jet recording head unit is produced from a combination of a plurality of ink-jet recording heads that have piezoelectric layers whose coercive electric fields vary significantly from one to another, it is impossible to equalize the displacement characteristic of the piezoelectric elements of one ink-jet recording head with that of other ink-jet recording heads when the plurality of ink-jet recording heads are driven by a driving pulse having the same waveform. As a result thereof, disadvantageously, it is impossible to uniformize (i.e., make uniform) the ink-discharge characteristic of the plurality of the ink-jet recording heads assembled into one head unit.

On the other hand, a more complex configuration will be required if pulses having waveforms different from one another are used to drive the plurality of ink-jet recording heads of one head unit that have coercive electric fields varying from one to another, which results in increased production cost.

The same problem occurs if two coercive electric fields of the piezoelectric layer in hysteresis characteristic are located in the same electric-field polarity as disclosed in JP-A-2003-243741.

The above-identified problem is not unique to a method of producing an ink-jet recording head unit that has a plurality of ink-jet recording heads combined with one another. That is, the above-identified problem could also occur in a method of producing a variety of liquid ejecting head unit that has a plurality of liquid ejecting heads combined with one another, where the plurality of liquid ejecting heads eject various kinds of liquid including ink but not limited thereto.

SUMMARY

An advantage of some aspects of the invention is to provide a method of producing a liquid ejecting head unit that achieves uniform and thus enhanced liquid ejecting characteristics with reduced production cost.

In order to address the above-identified problem without any limitation thereto, the invention provides, as an aspect thereof, a method of producing a liquid ejecting head unit that has a plurality of liquid ejecting heads combined with one another, each of the plurality of liquid ejecting heads having a fluid channel formation substrate, which has pressure generation chambers that are in communication with nozzle orifices through which liquid is ejected, and piezoelectric elements, each of which is made up of a lower electrode, a piezoelectric layer that has hysteresis characteristic in a polarization electric field, and an upper electrode, formed on the fluid channel formation substrate with a vibrating plate being interposed therebetween, the liquid ejecting head unit production method including: acquiring coercive electric fields of the piezoelectric layers of the liquid ejecting heads; classifying the liquid ejecting heads into ranks on the basis of the acquired coercive electric fields; and combining the liquid ejecting heads that belong to the same rank together. The liquid ejecting head unit production method according to the above-described aspect of the invention makes it possible to minimize variation among the coercive electric fields of the plurality of liquid ejecting heads that are assembled into one liquid ejecting head unit as much as possible. As a result thereof, just by applying the same driving voltage pulse to the liquid ejecting heads, it is possible to make the liquid ejection characteristic of the liquid ejecting heads of one liquid ejecting head unit uniform and thus to achieve enhanced liquid ejection characteristics thereof. In addition, since it is possible to apply the same driving voltage pulse to the plurality of liquid ejecting heads of one liquid ejecting head unit, cost of production can be reduced.

In the liquid ejecting head unit production method according to the above-described aspect of the invention, it is preferable that the piezoelectric layer is made of lead zirconate titanate. By this means, the invention can be applied to the piezoelectric layer that has asymmetrical hysteresis characteristic in a polarization electric field.

In the liquid ejecting head unit production method according to the above-described aspect of the invention, it is preferable that the coercive electric field of the piezoelectric layer is acquired by measuring a point of polarization at which displacement of piezoelectric layer is reversed as a voltage applied to the piezoelectric layer is changed. By this means, the coercive electric field of the piezoelectric layer can be acquired by measuring point of polarization at which displacement of piezoelectric layer is reversed.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, exemplary embodiments of the present invention are described in detail below.

Embodiment 1

Figure 1:
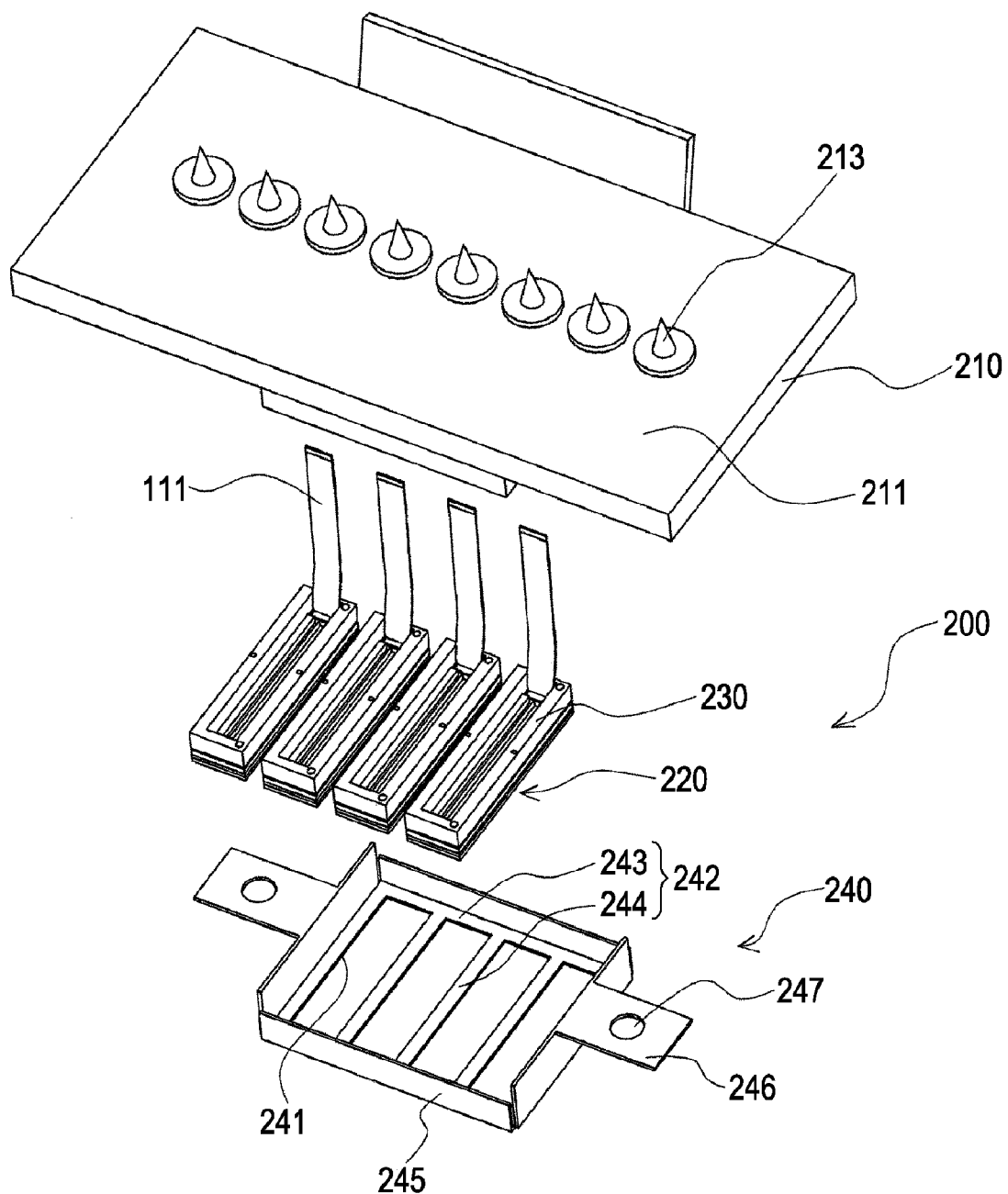
FIG. 1 is an exploded perspective view that schematically illustrates an example of a head unit according to a first embodiment of the invention.
Figure 2:
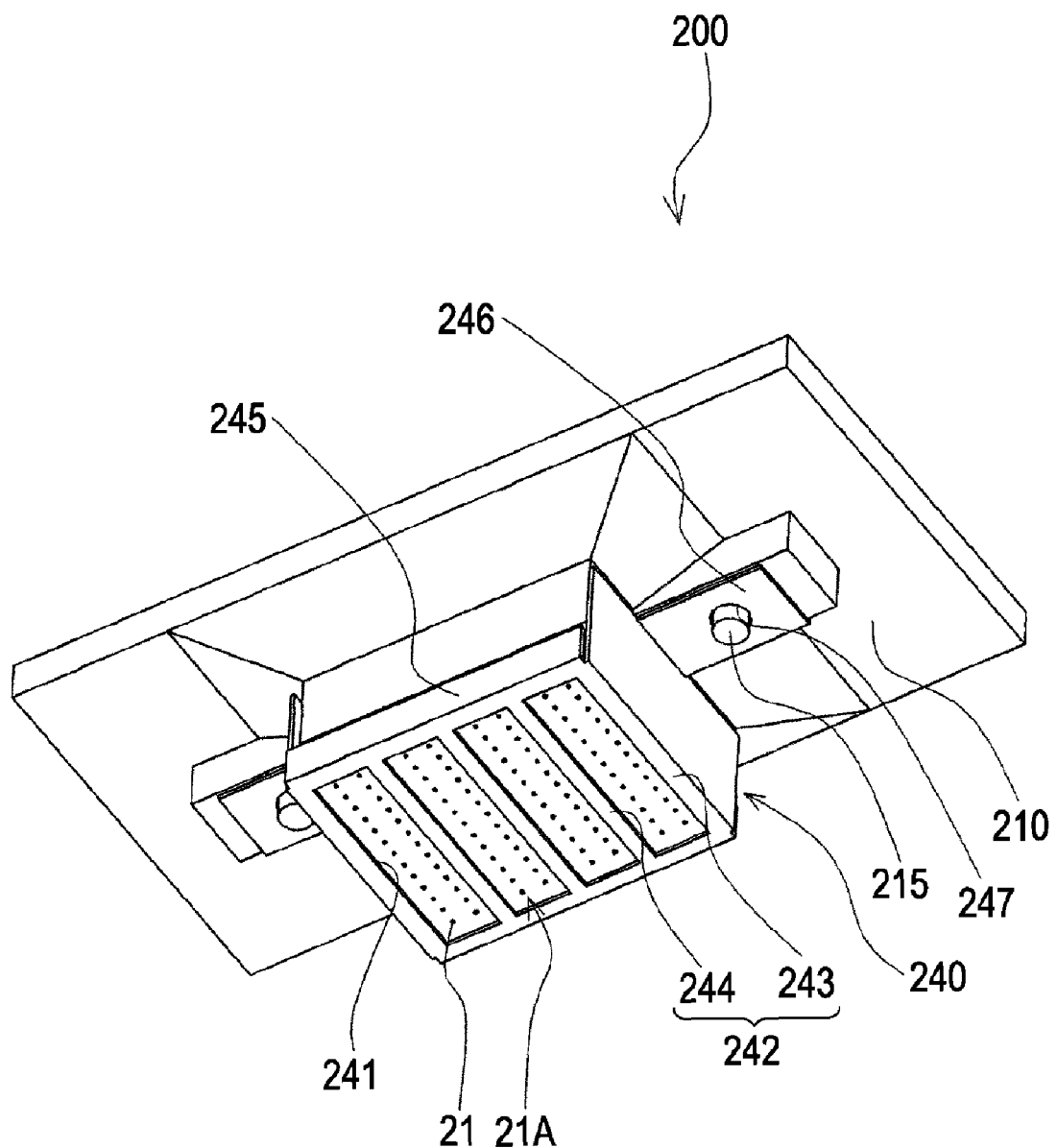
FIG. 2 is assembled perspective view that schematically illustrates an example of the head unit according to the first embodiment of the invention.
Figure 3:
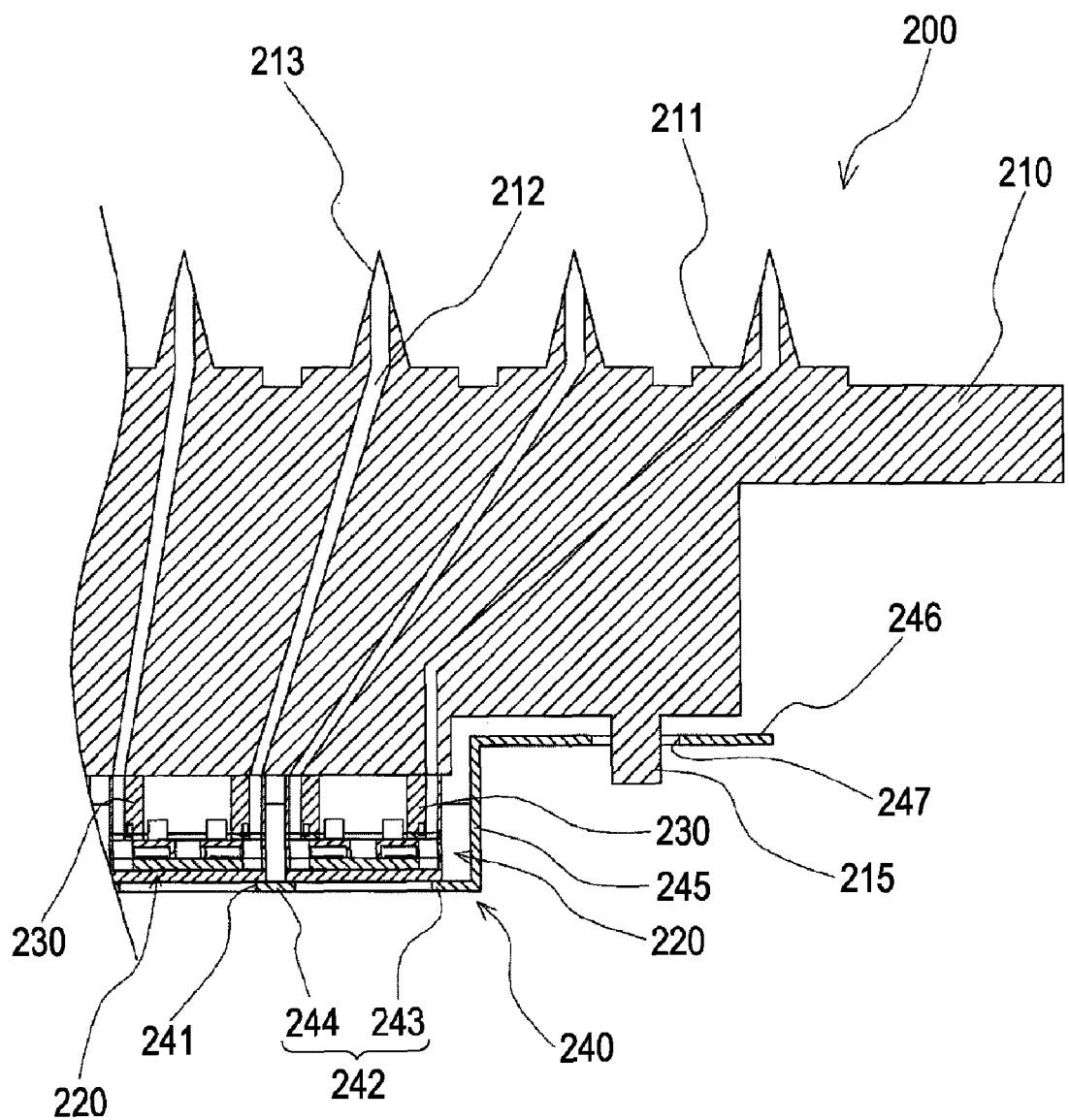
FIG. 3 is a sectional view of the essential components of the head unit according to the first embodiment of the invention.

FIG. 1 is an exploded perspective view that schematically illustrates the exemplary configuration of an ink-jet recording head unit, which is illustrated herein as an example of a liquid ejecting head unit according to a first embodiment of the invention. FIG. 2 is an assembled perspective view of the ink-jet recording head unit illustrated in FIG. 1. FIG. 3 is a sectional view of the ink-jet recording head unit that schematically illustrates the essential components thereof. As illustrated in FIG. 1, a cartridge case 210, which is a supporting member that constitutes a part of an ink-jet recording head unit (hereafter referred to as "head unit") 200 that is illustrated herein as an example of a liquid ejecting head unit, is provided with a cartridge attachment unit 211 to which a plurality of ink cartridges is detachably attached. The ink cartridges that are not shown in the drawing function as ink-supply units (liquid supplying means). In the present embodiment of the invention, each of the ink cartridges is configured as an independent unit separated therefrom. Black ink and three color inks are filled and retained in these ink cartridges, where each cartridge contains one ink color thereof. These ink cartridges of respective ink colors are attached to the cartridge case 210. As illustrated in FIG. 3, a plurality of ink communicating passages 212 is provided in the bottom portion of the cartridge case 210. Specifically, one end of each of the plurality of ink communicating passages 212 opens at the cartridge attachment unit (211) side of the cartridge case 210, whereas the other end thereof opens at the head case (which will be described later) side thereof. At each open end of the ink communicating passages 212 at the cartridge attachment unit (211) side of the cartridge case 210, an ink supply needle 213, which is to be inserted through the ink supply port of an ink cartridge, is provided. Each of the ink supply needles 213 is attached thereto with a filter being interposed therebetween. The filter, which is not shown in the drawings is provided in the ink communicating passage 212 in order to catch any air bubble and/or foreign object that are present in ink.

The head cases 230 to which the ink-jet recording heads 220 are attached are provided on the bottom surface of the cartridge case 210. Each of the ink-jet recording heads 220 is provided with a plurality of piezoelectric elements 300. Through the driving of the piezoelectric elements 300, the ink-jet recording head 220 discharges ink drops from its nozzle openings (holes or orifices) 21 at one surface thereof that is opposite to the other surface facing the cartridge case 210. In the present embodiment of the invention, a plurality of the ink-jet recording heads 220 correspond to respective ink colors so that each of the ink-jet recording heads 220 discharges ink of a corresponding color retained in an ink cartridge. Accordingly, a plurality of the head cases 230 are provided, each on an independent basis, so as to correspond to the plurality of the ink-jet recording heads 220.

Figure 4:
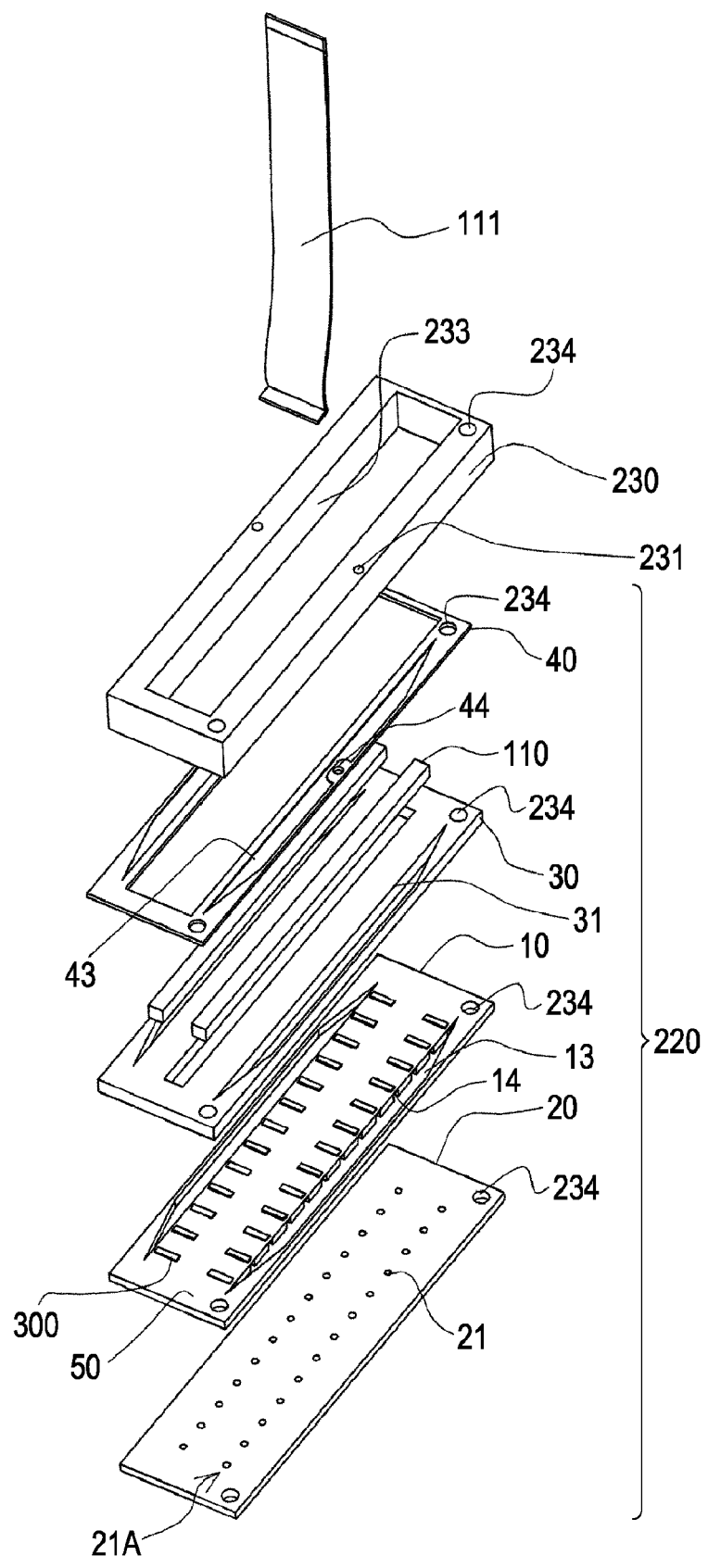
FIG. 4 is an exploded perspective view that schematically illustrates the essential components of the head unit according to the first embodiment of the invention.
Figure 5:
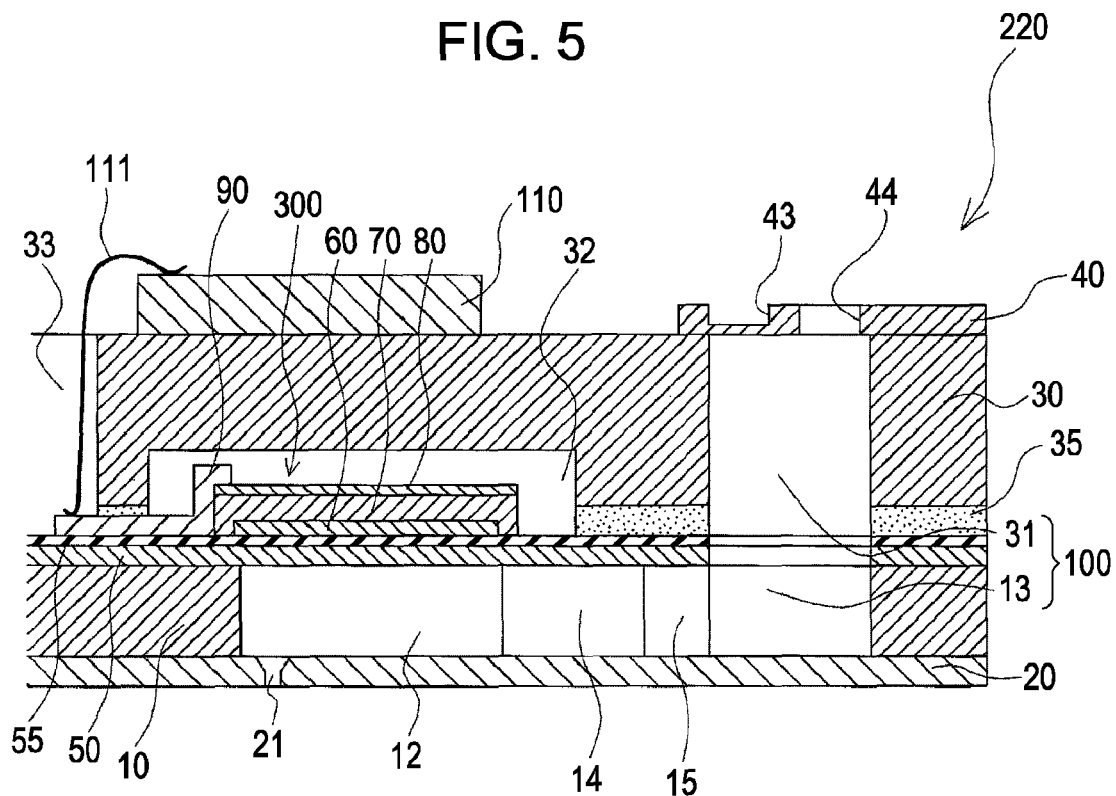
FIG. 5 is a sectional view of a recording head according to the first embodiment of the invention.

In the following description, an explanation is given of the ink-jet recording heads 220, which is an example of liquid ejecting heads according to the present embodiment of the invention, and the head cases 230, which are mounted to the cartridge case 210. FIG. 4 is an exploded perspective view of the ink-jet recording head 220 and the head case 230 that schematically illustrates an example of the essential components thereof. FIG. 5 is a sectional view that schematically illustrates an example of the ink-jet recording head 220.

As illustrated in FIGS. 4 and 5, in the present embodiment of the invention, a fluid channel formation substrate 10 that constitutes a part of the ink-jet recording head 220 is made of silicon single crystal. An elastic membrane 50, which is made of silicon dioxide, is pre-formed on one surface of the fluid channel formation substrate 10 through thermal oxidation. Pressure generation chambers (i.e., compartments) 12, which are demarcated by a plurality of partition walls, are formed in the fluid channel formation substrate 10 In the example explained herein, two lines of the pressure generation chambers 12, viewed in the width direction of the fluid channel formation substrate 10, are formed therein. By employing an anisotropic etching technique, the pressure generation chambers 12 are formed from the opposite side of the fluid channel formation substrate 10. A communicating portion 13 is formed at an area outside of each line of pressure generation chambers 12, viewed in the longitudinal direction thereof. Each of the communicating portions 13 is in communication with a reservoir portion 31 that is provided in the protection substrate 30 that will be described later. In communication with each other, the communicating portion 13 and the reservoir portion 31 constitute a reservoir 100, which serves as a common ink chamber/compartment for each of the pressure generation chambers 12. The communicating portion 13 is in communication with the "longitudinal-direction-one-end-portion" of each of the pressure generation chambers 12 via an ink supply passage 14 and a communicating passage 15. Herein, the communicating passage 15 has approximately the same width as that of the pressure generation chamber 12. On the other hand, the ink supply passage 14 has a width narrower than the pressure generation chamber 12 so as to give a predetermined fluid channel resistance.

A nozzle plate 20 is adhered to the opening-surface-side of the fluid channel formation substrate 10 by means of an adhesive, a thermal deposition/welding film, or any other similar alternative means. A plurality of nozzle orifices (i.e., nozzle openings or holes) 21 is bored through the nozzle plate 20. Each nozzle orifice 21 is communicated with one end of each of the pressure generation chambers 12 opposite to the communicating-passage-side (15) end thereof. In the present embodiment of the invention, two nozzle lines 21A, which are constituted by a pair of lines of the nozzle openings 21 formed in parallel with each other, are provided in each of the ink-jet recording heads 220. The nozzle plate 20 may be made of, for example, glass ceramics, silicon single crystal substrate, stainless steel, or the like.

As has already been mentioned above, the elastic membrane 50 having a thickness of, for example, approximately 1.0 μm is formed on the other surface of the fluid channel formation substrate 10 that is opposite to the opening surface thereof. An insulating film 55 having a thickness of, for example, approximately 0.3-0.4 μm is deposited on the elastic membrane 50. The insulating film 55 is made of, for example, zirconium oxide ($ZrO_2$) or the like. Piezoelectric elements 300 are provided on the insulating film 55. The piezoelectric elements 300 are made up of a lower electrode film 60 having a thickness of, for example, approximately 0.1-0.5 μm, a piezoelectric layer 70 having a thickness of, for example, approximately 1.1 μm, and an upper electrode film 80 having a thickness of, for example, approximately 0.05 μm. The piezoelectric layer 70 is made of dielectric material such as lead zirconate titanate (PZT) or the like. The lamination of the lower electrode film 60, the piezoelectric layer 70, and the upper electrode film 80 constitutes the piezoelectric element 300. Generally speaking, either one of the lower electrode 60 and the upper electrode 80 of the piezoelectric elements 300 is configured as a common electrode, whereas the other thereof as well as the piezoelectric layer 70 are individually patterned for each of the pressure generation chambers 12. In this specification, a region of layers that is constituted by the piezoelectric layer 70 and either one of the lower electrode 60 and the upper electrode 80, which are individually patterned for each of the pressure generation chambers 12, is referred to as a "piezoelectric activation portion", where the piezoelectric activation portion indicates a region of layers at which piezoelectric distortion/deflection occurs at the time of application of a voltage to both electrodes. In the present exemplary embodiment of the invention, the lower electrode film 60 is configured as the common electrode of the piezoelectric elements 300, whereas the upper electrode film 80 is configured as the individual electrodes thereof. Notwithstanding the foregoing, the lower electrode film 60 and the upper electrode film 80 may be reversed if it is required or advantageous because of the circuit line patterning, driving circuit layout, and/or any other similar reasons Whichever configuration is chosen, one piezoelectric activation portion is formed for each of the pressure generation chambers 12. In addition, in this specification, the piezoelectric elements 300 and a vibrating plate (i.e., diaphragm) that is displaced when driven by the piezoelectric elements 300 are correctively referred to as an actuator device. In the exemplary configuration described above, the elastic membrane 50, the insulating film 55, and the lower electrode film 60 function as the vibrating plate. However, the invention is not limited to such an exemplary configuration but may be modified, for example, in such a manner that the lower electrode film 60 only functions as the vibrating plate while omitting the elastic membrane 50 and the insulating film 55 from the configuration.

Figure 6A:
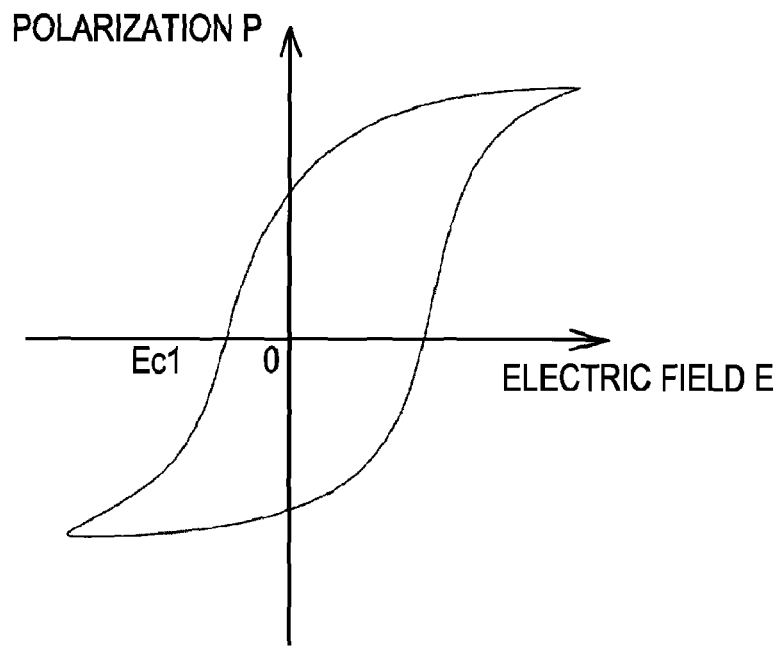
FIGS. 6A and 6B is a set of diagrams that illustrates the hysteresis characteristic and the point of polarization of a piezoelectric layer according to the first embodiment of the invention.

The piezoelectric layer 70 of the piezoelectric element 300 that constitutes a part of the ink-jet recording head according to the present embodiment of the invention is configured as a thin film that has been subjected to polarization treatment. As illustrated in FIG. 6A, the piezoelectric layer 70 of the piezoelectric element 300 has hysteresis characteristic; that is, when the electric field applied to the piezoelectric layer 70 changes, the polarity thereof reverses where a coercive electric field $Ec1$ acts as a threshold for the inversion of positive/negative polarity.

Figure 6B:
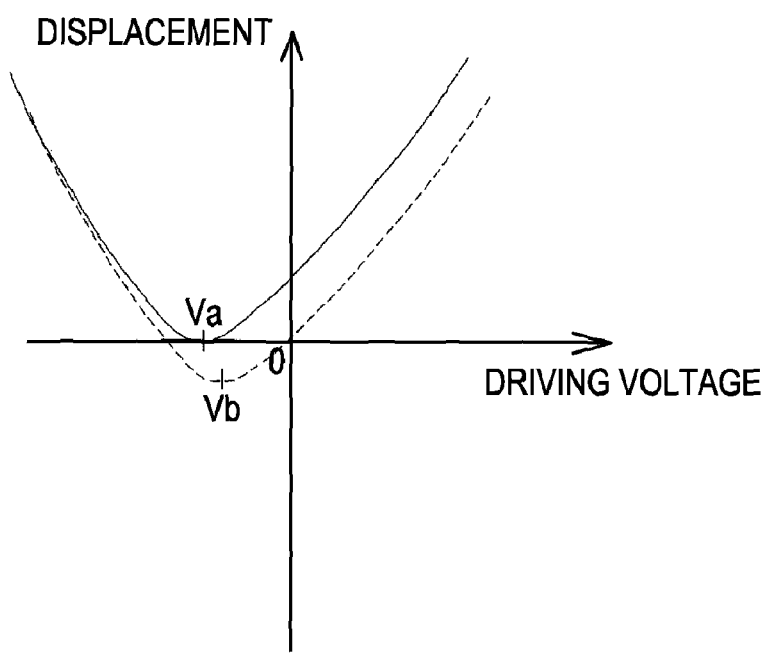

The coercive electric field $Ec1$ of the piezoelectric layer 70 can be acquired by measuring the amount of displacement of the piezoelectric element 300 while changing the level of a voltage applied to the piezoelectric element 300, and by measuring the point of polarization at which the displacement direction of the piezoelectric element 300 is reversed. That is, as illustrated in FIG. 6B, it is represented as a butterfly curve where the displacement direction of the piezoelectric element 300 is reversed at the point of polarization of the predetermined voltage $Va$ as the level of a voltage applied to the piezoelectric element 300 is changed. The coercive electric field $Ec1$ of the piezoelectric layer 70 can be acquired by measuring the voltage $Va$ at the point of polarization.

The coercive electric field $Ec1$ of the piezoelectric layer 70 could vary from one to another depending on factors such as the manufacturing condition of the piezoelectric element 300 or the like. For example, the measurement could vary within a dispersion/scattering range of approximately 0.5 V. As illustrated in FIG. 6B, for example, the point of polarization $Va$ of the voltage-displacement curve of one piezoelectric element 300 could be shifted for another piezoelectric element 300, which is denoted as a point of polarization $Vb$. Each of the layers that constitute the piezoelectric element 300 can be formed by means of a film deposition and lithography technique. In particular, the piezoelectric layer 70 can be formed by a sol-gel method, an MOD method, a sputtering method, and the like. The variations of the coercive electric field $Ec1$ of the piezoelectric layer 70 (point of polarization $Va$), that is, dispersion or scattering thereof, are not so large within an ink-jet recording head 220. However, significantly large variations could occur when a plurality of chip-size ink-jet recording heads 220 are formed on a single piece of silicon wafer at the same time, varying from one chip to another or one wafer to another.

For this reason, in the exemplary embodiment of the invention, after the formation of a plurality of ink-jet recording heads 220, the coercive electric field $Ec1$ of the piezoelectric layer 70 of the piezoelectric elements 300 for each of the ink-jet recording heads 220 is acquired; and on the basis of the acquired coercive electric fields $Ec1$, the ink-jet recording heads 220 are classified into ranks (i.e, classes). The detail of the above-mentioned rank classification will be described later. Then, a plurality of the ink-jet recording heads 220 that belong to the same rank are assembled together to constitute one head unit. In this way, it is possible to reduce variations in the coercive electric fields $Ec1$ of the plurality of ink-jet recording heads 220 in the head unit.

A lead electrode 90, which is made of gold (Au) or the like, is connected to the upper electrode film 80 of each of the piezoelectric elements 300. The lead electrodes 90 extend from the proximity of one end of the upper electrode film 80 that is opposite to the other end thereof that is closer to the ink supply passage 14. The lead electrodes 90 extend onto the insulating film 55. Voltages are applied in a selective manner to the piezoelectric elements 300 via the lead electrodes 90.

The protection substrate 30 having the reservoir portion 31 that constitutes at least a part of the reservoir 100 is bonded to, by means of an adhesive 35, the fluid channel formation substrate 10 that has the piezoelectric elements 300 formed thereon. In the present embodiment of the invention, the reservoir portion 31 is formed in such a manner that it penetrates the protection substrate 30 in a thickness direction thereof while extending in the width direction of the pressure generation chamber 12. As has already been described, the reservoir portion 31 is in communication with the communicating portion 13 of the fluid channel formation substrate 10 in such a manner that the reservoir portion 31 and the communicating portion 13 constitute the reservoir 100, which serves as a common liquid chamber/compartment for each of the pressure generation chambers 12. As an example of alternative configurations, the communicating portion 13 of the fluid channel formation substrate 10 may be divided into a plurality of demarcated portions thereof so as to correspond to the respective pressure generation chambers 12. In such a configuration, the reservoir portion 31 only constitutes the reservoir 100. As another example of alternative configurations, it may be configured that the pressure generation chambers 12 only are provided in the fluid channel formation substrate 10, and that the ink supply passages 14 each of which makes the reservoir 100 in communication with the corresponding one of the pressure generation chambers 12 are formed in a member that is interposed between the fluid channel formation substrate 10 and the protection substrate 30. As a few examples of such a member that is interposed between the fluid channel formation substrate 10 and the protection substrate 30, the ink supply passages 14 may be formed in the elastic membrane 50, the insulating film 55, or the like.

A piezoelectric holding portion 32 is provided at an area opposed to each of the piezoelectric elements 300 of the protection substrate 30. The piezoelectric holding portion 32 is provided while leaving a space that is wide enough so as not to obstruct the motion of the piezoelectric element 300. The protection substrate 30 has an inner space that is wide enough so as not to obstruct the motion of the piezoelectric elements 300. As long as the space is sufficiently large so as not to hamper the movement of the piezoelectric elements 300, it may be sealed or not sealed.

It is preferable that the protection substrate 30 should be made of a material having substantially the same coefficient of thermal expansion as that of the fluid channel formation substrate 10 such as glass, ceramic material, or the like. In the present exemplary embodiment of the invention, the protection substrate 30 is made of a silicon single crystal substrate, that is, the same material that constitutes the fluid channel formation substrate 10.

A through hole 33, which penetrates through the protection substrate 30 in its thickness direction, is provided in the protection substrate 30. The region in the proximity of the end portion of the lead electrode 90 that extends from each of the pressure generation chambers 12 is exposed inside the through hole 33.

A driving circuit 110, which drives the piezoelectric elements 300 arrayed as parallel two lines, is mounted on the protection substrate 30. For example, a circuit board and semiconductor integrated circuits (IC) may constitute the driving circuit 110. The driving circuit 110 is electrically connected to the lead electrodes 90 via a connection wiring 111 that is made up of conductive wires such as bonding wires or the like.

A compliance substrate 40 is adhered to the protection substrate 30. Ink feed holes (i.e., ink supply port) 44, each of which is provided to supply ink to the reservoir 100, are formed at some part of a region of the compliance substrate 40 opposed to the reservoir 100 in such a manner that the ink feed hole 44 penetrates through the compliance substrate 40 in a thickness direct on thereof. The remaining part of the region of the compliance substrate 40 opposed to the reservoir 100, that is, the other part of the region opposed to the reservoir 100 where the ink feed hole 44 are not formed, is formed each as a flexible portion 43 having a relatively smaller thickness. The flexible portion 43 seals the reservoir 100. The flexible portions 43 give compliance inside the reservoir 100.

As explained above, the ink-jet recording head 220 according to the present embodiment of the invention is made up of four substrates, that is, the nozzle plate 20, the fluid channel formation substrate 10, the protection substrate 30, and the compliance substrate 40. As illustrated in FIG. 4, the head case 230 that has ink supply communicating passages 231 is provided on the compliance substrate 40 of the ink-jet recording head 220 On one hand, each of the ink supply communicating passages 231 is in communication with the corresponding one of the ink feed holes 44. On the other hand, each of the ink supply communicating passages 231 is further in communication with the corresponding one of the ink communicating passages 212 of the cartridge case 210. With such a configuration, each of the ink supply communicating passages 231 supplies ink from the cartridge case 210 to the corresponding one of the ink feed holes 44.

The ink-jet recording head 220 according to the present embodiment of the invention having the configuration described above operates as follows. First of all, ink retained in an ink cartridge enters and flows through the ink communicating passage 212, the ink supply communicating passage 231, and the ink feed hole 44 in the order of appearance herein. The inner fluid channel structure from the reservoir 100 to the nozzle orifices 21 is filled with the supplied ink. Thereafter, in accordance with a recording signal sent from the driving circuit 110, a voltage is applied to the piezoelectric element 300 that corresponds to each of the pressure generation chambers 12 so as to deflect and deform the elastic membrane 50, the insulating film 55, and the piezoelectric element 300. By this means, the inner pressure of each of the pressure generation chambers 12 is raised; and as a result thereof, ink drops are discharged from the nozzle orifice 21.

Each member/component that makes up the ink-jet recording head 220 described above as well as the head case 230 is provided with pin insertion holes 234, which are formed at two of four corners thereof to be used for positional determination of these members/components at the time of assembly thereof. A pin is inserted through each of the pin insertion holes 234 so as to make relative positional determination between these members and/or components, followed by bonding of these members and/or components together with the positional determination pins being inserted therethrough. By this means, the ink-jet recording head 220 and the head case 230 are assembled into a single integrated unit.

The ink-jet recording heads 220 described above are manufactured as follows. First of all, a large number of chips are formed at the same time on a single piece of silicon wafer. Then, the nozzle plate 20 and the compliance substrate 40 are bonded thereto so as to form a single integrated in-process product. Subsequently, the single integrated in-process wafer is diced into a number of the fluid channel formation substrates 10 illustrated in FIG. 4, each having one chip size thereof. This is how the ink-jet recording heads 220 described above are manufactured.

After the formation of a plurality of ink-jet recording heads 220, as has already been mentioned above, the coercive electric field Ec1 of the piezoelectric layer 70 of the piezoelectric elements 300 for each of the ink-jet recording heads 220 is acquired; and on the basis of the acquired coercive electric fields Ec1, the ink-jet recording heads 220 are classified into ranks. The rank classification of the ink-jet recording heads 220 are performed in such a manner that variation, that is, dispersion or scattering, among the coercive electric fields Ec1 of the ink-jet recording heads 220 that belong to the same rank is minimized as much as possible. Specifically, after specifying a range of the coercive electric field Ec1 for each of a plurality of ranks, the ink-jet recording heads 220 having the coercive electric fields Ec1 that fall within a certain specified range are classified into the same rank. In this way, variation among the coercive electric fields Ec1 of the ink-jet recording heads 220 that belong to the same rank is minimized as much as possible.

After classification of the ink-jet recording heads 220 into ranks on the basis of the respective coercive electric fields Ec1, the ink-jet recording heads 220 that belong to the same rank are assembled together so as to manufacture the head unit 200. By this means, variation among the coercive electric fields Ec1 of the plurality of ink-jet recording heads 220 that are assembled into one head unit 200 is minimized as much as possible. As a result thereof, just by applying the same driving voltage pulse to the ink-jet recording heads 220, it is possible to make the ink-discharge characteristic of the ink-jet recording heads 220 of one head unit 200 uniform and thus to achieve enhanced ink-discharge characteristics thereof.

Figure 7:
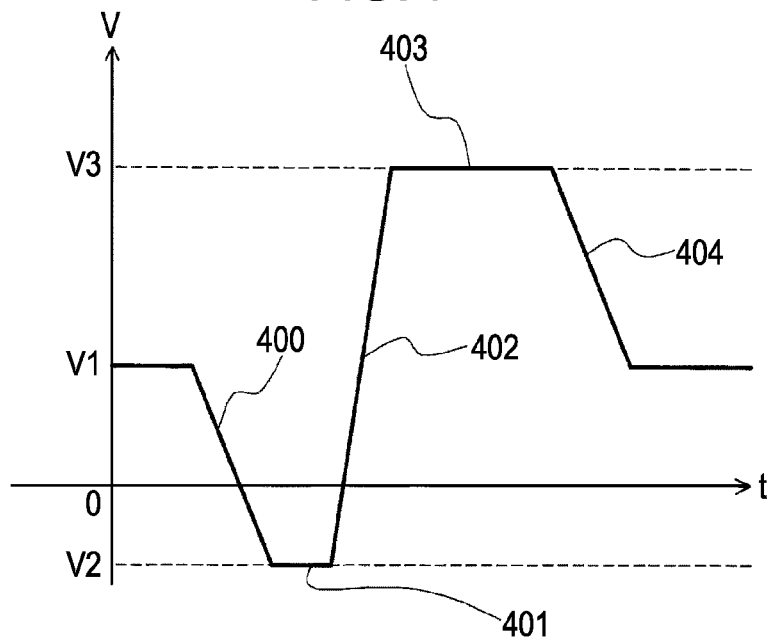
FIG. 7 is a waveform diagram that illustrates an example of a driving voltage pulse according to the first embodiment of the invention.

Next, with reference to FIG. 7, an example of a driving voltage pulse for driving the ink-jet recording heads 220 is explained below. FIG. 7 is a waveform diagram that illustrates an example of a driving voltage pulse.

A driving voltage pulse is applied to the upper electrode film 80 with the lower electrode film 60 functioning as a reference potential. As illustrated in FIG. 7, an operation cycle of the waveform of a driving voltage pulse is made up of a discharge preparation step 400, a first level-maintenance step 401, a discharge step 402, a second level-maintenance step 403, and a voltage drop step 404. In the discharge preparation step 400, the level of a driving voltage V is lowered from a reference voltage V1 to a discharge preparation voltage V2 that is lower than the reference voltage V1 so as to expand the volume of the pressure generation chamber 12. The level of the discharge preparation voltage V2 is kept for a predetermined time period during the first level-maintenance step 401. In the discharge step 402, the level of the driving voltage V is raised from the discharge preparation voltage V2 to a discharge voltage V3 that is higher than the reference voltage V1 so as to contract the volume of the pressure generation chamber 12. The level of the discharge voltage V3 is kept for a predetermined time period during the second level-maintenance step 402. In the voltage drop step 404, the level of the driving voltage V is dropped from the discharge voltage V3 to the reference voltage V1.

In the ink-jet recording head according to the present embodiment of the invention, when the above-described driving voltage pulse is outputted to the piezoelectric element 300, as a first step, the driving voltage V that is applied to the lower electrode film 60 and the upper electrode film 80 is lowered from the reference voltage V1 to the discharge preparation voltage V2 in the discharge preparation step 400 so that the piezoelectric element 300 is deflected (displaced) in a direction to expand the volume of the pressure generation chamber 12. That is, in the discharge preparation step 400, the piezoelectric element 300 gets deflected from an initial displacement state to a discharge preparation displacement state. This causes the volume of the pressure generation chamber 12 to be expanded so as to draw a meniscus residing in the nozzle orifice 21 toward the pressure generation chamber 12.

Next, after the level is kept for a certain time period in the first level-maintenance step 401, the driving voltage V that is applied to the piezoelectric element 300 is raised from the discharge preparation voltage V2 to the discharge voltage V3 in the discharge step 402 so that the piezoelectric element 300 is deflected (displaced) in a direction to contract the volume of the pressure generation chamber 12. This causes the meniscus residing in the nozzle orifice 21 to be forced out from the pressure-generation-chamber (12) side so that ink drops are discharged from the nozzle orifice 21.

It is preferable that the discharge preparation voltage V2 is set at a voltage level that provides an electric-field intensity that is not less than the above-described coercive electric field Ec1 of the piezoelectric layer 70 illustrated in FIG. 6. In addition, it is preferable that the discharge voltage V3 is set at a voltage level that provides an electric-field intensity that is less than an electric field that supplies saturation polarization of the piezoelectric layer 70 illustrated in FIG. 6. This is because, if the discharge preparation voltage V2 is set at a voltage level that provides an electric-field intensity that is less than the coercive electric field Ec1, the electric-field intensity goes across the coercive electric field Ec1 of the piezoelectric layer 70 when the driving voltage V is raised from the discharge preparation voltage V2 to the discharge voltage V3, which results in the decreased displacement of the piezoelectric element 300 due to repeated driving thereof. In other words, if the discharge preparation voltage V2 is set at a voltage level that provides an electric-field intensity that is not less than the coercive electric field Ec1 (i.e., not less than the point of polarization Va), it is possible to prevent any decreased displacement of the piezoelectric element 300 due to repeated driving thereof. This makes it further possible to prevent any degradation in discharge characteristic thereof and to achieve a larger displacement of the piezoelectric element 300. It should be noted that, advantageously, a relatively large displacement of the piezoelectric element 300 is achieved if the discharge preparation voltage V2 is set at a voltage level that provides an electric-field intensity that is relatively close to the coercive electric field Ec1.

The piezoelectric layer 70 may be configured in such a manner that one of two coercive electric fields thereof has the same polarity as that of the other. Alternatively, the piezoelectric layer 70 may be configured in such a manner that two coercive electric fields thereof have polarities opposite to each other. Whichever configuration is chosen, it is preferable that the discharge preparation voltage V2 is set at a voltage level that provides an electric-field intensity that is not less than the coercive electric field Ec1. According to the characteristic of the piezoelectric layer 70, the amount of actual displacement is relatively large when a voltage transitioning from a negative polarity to a positive polarity is applied. For this reason, it is preferable to adopt the piezoelectric layer 70 whose coercive electric fields have polarities opposite to each other.

Subsequently, the displacement of the piezoelectric element 300 is returned to its original state as the driving voltage pulse goes through the second level-maintenance step 403 and the voltage drop step 404. Specifically, the discharge voltage V3 is kept for a predetermined time period during the second level-maintenance step 403 so as to attenuate the vibration of the meniscus. Thereafter, the level of the driving voltage V is dropped from the discharge voltage V3 to the initial voltage V1. By this means, the displaced piezoelectric element 300 returns to its original state. Accordingly, the volume of the pressure generation chamber 12 also returns to its original capacity.

As described above, if the driving voltage pulse is set on the basis of the coercive electric field Ec1 of the piezoelectric layer 70, it is possible to prevent any decreased displacement of the piezoelectric element 300 due to repeated driving thereof, which achieves a larger displacement of the piezoelectric element 300. In addition thereto, a relatively large displacement of the piezoelectric element 300 is achieved if the discharge preparation voltage V2 is set at a voltage level that provides an electric-field intensity that is relatively close to the coercive electric field Ec1. For these reasons, as described above, the ink-jet recording heads 220 are classified into ranks on the basis of the coercive electric fields Ec1; thereafter, the ink-jet recording heads 220 that belong to the same rank are assembled together so as to manufacture the head unit 200. By this means, it is possible to avoid the application of a voltage that provides an electric-field intensity that goes across the coercive electric field Ec1 to any one of the plurality of ink-jet recording heads 220 that are assembled together in one head unit 200. In addition thereto, it is possible to set the discharge preparation voltage V2 at a voltage level that provides an electric-field intensity that is close to the coercive electric field Ec1 for each of the ink-jet recording heads 220. Therefore, it is possible to apply a driving voltage pulse that achieves a larger displacement of the piezoelectric element 300 to the ink-jet recording heads 220 that are assembled together in one head unit 200. Moreover, it is possible to make the ink-discharge characteristic of the ink-jet recording heads 220 of one head unit 200 uniform and thus to achieve enhanced ink-discharge characteristics thereof. If a plurality of the ink-jet recording heads 220 having the coercive electric fields Ec1 varying significantly from one to another are assembled together to manufacture the head unit 200, there is an adverse possibility that a voltage that provides an electric-field intensity that goes across the coercive electric field Ec1 is applied to one or more of the ink-jet recording heads 220 that are assembled together in one head unit 200. In addition thereto, it is not possible to set the discharge preparation voltage V2 at a voltage level that provides an electric-field intensity that is close to the coercive electric field Ec1 for each of the ink-jet recording heads 220.

In the above-described example of the present embodiment of the invention, the discharge preparation voltage V2 is set at a voltage level that provides an electric-field intensity that is not less than the coercive electric field Ec1. However, the discharge preparation voltage V2 may be set at a voltage level that provides an electric-field intensity that is less than the coercive electric field Ec1. Whichever configuration is chosen, it is possible to make the ink-discharge characteristic of the ink-jet recording heads 220 of one head unit 200 uniform and thus to achieve enhanced ink-discharge characteristics thereof.

Four of the assembled combinations of the ink-jet recording heads 220 and the head cases 230 are fixed onto the above-described cartridge case 210 with a certain predetermined space allocated each therebetween in such a manner that these assembled combinations are arranged in a direction in which the nozzle lines 21A thereof are aligned with one another. That is, eight lines, in total, of the nozzle lines 21A are provided in the head unit 200 according to the present embodiment of the invention. As described above, by increasing the number of a pair of the nozzle lines 21A, which is made up of the nozzle openings 21 arrayed as parallel two lines on the ink-jet recording head 220, by means of not a singularity but a plurality of the ink-jet recording heads 220, it is possible to ensure a relatively high production yield rate in comparison with a case where an increased number (i.e., in this context, more than two) of the nozzle lines 21A are formed on just one ink-jet recording head 220. In addition thereto, the use of a plurality of the ink-jet recording heads 220 for the purpose of increasing the number of the nozzle lines 21A makes it possible to also increase the number of chips, each of which is used as a material for the ink-jet recording head 220, that can be diced out of a single piece of silicon wafer. Therefore, it is further possible to decrease the wasted area of the silicon wafer, thereby efficiently reducing the production cost thereof.

As illustrated in FIGS. 1 and 2, the relative positions of four ink-jet recording heads 220 that are supported by the cartridge case 210 with the head cases 230 being interposed therebetween are determined by the cover head 240. The cover head 240 has an opening portion 241 and a fixing portion 242. The opening portion 241 of the cover head 240 exposes the nozzle orifices 21 The fixing portion 242 thereof, which demarcates the opening portion 241, are bonded to at least both side portions of a pair of the nozzle lines 21A, which is made up of the nozzle openings 21 arrayed as parallel two lines, on the ink-drop discharging surfaces of these ink-jet recording heads 220.

In the present embodiment of the invention, the fixing portion 242 of the cover head 240 is made up of a frame portion 243 and beam portions 244. The frame portion 243 of the fixing portion 242 is a peripheral frame that encloses the ink-drop-discharging surfaces of these ink-jet recording heads 220. Each of the beam portions 244 thereof extends between two of the ink-jet recording heads 220 adjacent to each other in such a manner that these beam portions 244 divide/split the opening portion 241. The frame portion 243 and the beam portions 244 are bonded to the ink-drop discharging surfaces of these ink-jet recording heads 220. In addition, the frame portion 243 of the fixing portion 242 is configured to cover the pin insertion holes 234, which are formed for positional determination of members/components at the time of production of the ink-jet recording heads 220. The cover head 240 further has a sidewall portion 245. The sidewall portion 245 is formed by bending a cover head material in such a manner that each side thereof extends toward the side of the ink-jet recording head 220 so as to cover the peripheral edge of the ink-drop discharging surface thereof.

As described above, the fixing portion 242 of the cover head 240 is bonded to the ink-drop discharging surfaces of the ink-jet recording heads 220. With such a configuration, it is possible to make the difference in level between the ink-drop discharging surfaces of the ink-jet recording heads 220 and the cover head 240 relatively small. Thanks to such a smooth structure, it is further possible to prevent any ink from undesirably remaining on the ink-drop discharging surfaces thereof after wiping operation, suction operation, or the like, is performed thereon. In addition, since each of the beam portions 244 of the fixing portion 242 of the cover head 240 covers a gap between two ink-jet recording heads 220 adjacent to each other, it is possible to prevent ink from infiltrating between these two adjacent ink-jet recording heads 220. For this reason, the components of the ink-jet recording heads 220 such as the piezoelectric elements 300, the driving ICs 110, without any limitation thereto, are protected from otherwise possible degradation and/or damages due to the infiltration of ink. Moreover, since the ink-drop discharging surface of the ink-jet recording head 220 is bonded to the cover head 240 by means of an adhesive with no gap left therebetween, it is possible to prevent a recording target medium (such as paper) from entering (i.e., getting pinched/jammed) therebetween. Thus, the deformation of the cover head 240 and paper jam malfunction do not occur. Furthermore, since the ink-drop discharging surfaces of the plurality of ink-jet recording heads 220 are bonded to the cover head 240, the cover head 240 functions to adjust and thus uniformize (i.e., make uniform) the distance between the ink-drop discharging surfaces of the ink-jet recording heads 220 and the recording target medium such as a sheet of paper. With such a configuration, it is possible to make various ink-discharge characteristics including but not limited to ink-drop landing positions uniform among these ink-jet recording heads 220.

In addition thereto, it is possible to prevent the infiltration of ink over/into the side surfaces of the ink-jet recording heads 220 without failure because the sidewall portion 245 of the cover head 240 completely cover the outer edges of the ink-jet recording heads 220. Moreover, since the cover head 240 has the fixing portion 242 that is bonded to the ink-drop discharging surfaces of the ink-jet recording heads 220, when bonding is performed, it is possible to determine the position of each pair of the nozzle lines 21A of the plurality of ink-jet recording heads 220 with a high positional precision with respect to the cover head 240.

An example of conceivable materials for the cover head 240 is a metal such as stainless steel. The cover head 240 may be manufactured by press-working a metal plate, or alternatively, by metal-forming thereof. The cover head 240 can be grounded if an electrically conductive metal material is employed. The bonding of the cover head 240 and the nozzle plate 20 is not limited herein. As an example of various adhesion methods, a thermosetting epoxy adhesive may be used.

Flange portions 246 are provided on the fixing portion 242. Each of the flange portions 246 has a fixation hole 247, which is used for determining the position of the cover head 240 with respect to other members. A cover head material is bent from the sidewall portion 245 in a surface direction parallel to the ink-drop discharge surface so as to form each of the flange portions 246. As illustrated in FIGS. 2 and 3, in the present embodiment of the invention, the cover head 240 is fixed to the cartridge case 210, which functions as a supporting member that holds the ink-jet recording heads 220 and the head cases 230. Specifically, as illustrated in FIGS. 2 and 3, the cartridge case 210 is provided with projections 215 each of which protrudes toward the ink-drop discharge surface. The projections 215 are configured such that they can be inserted through the respective fixation holes 247 of the cover head 240. The cover head 240 is fixed to the cartridge case 210 by inserting the projections 215 through the respective fixation holes 247 of the cover head 240, and then by heat-caulking or heat-crimping the tip of each of the projections 215 As the diameter of each of the projections 215 provided on the cartridge case 210 is smaller than that of the corresponding fixation hole 247 of the flange portion 246, it is possible to determine the position of the cover head 240 in the direction of the ink-drop discharging surface, and then to attach the cover head 240 to the cartridge case 210 after positional alignment.

The cover head 240 is fixed to the ink-jet recording heads 220 by means of positional determination of the fixation holes 247 of the cover head 240 and the plurality of nozzle lines 21A. When performing the positional determination between the fixation holes 247 of the cover head 240 and the nozzle lines 21A of the ink-jet recording heads 220, a positional alignment tool made of a plate-like member that has a transparent property such as glass or the like may be used because the cover head 240 is bonded to the ink-drop discharging surfaces of the ink-jet recording heads 220.

The head unit 200 according to the present embodiment of the invention can be assembled by, after determining the relative positions of the cover head 240 and the ink-jet recording heads 220 for bonding thereof, attaching the head cases 230, each of which is bonded to the ink-feed-hole (44) side of the corresponding one of the ink-jet recording heads 220, to the cartridge case 210, and by fixing the projections 215 of the cartridge case 210 into the fixation holes 247 of the cover head 240.

Figure 8:
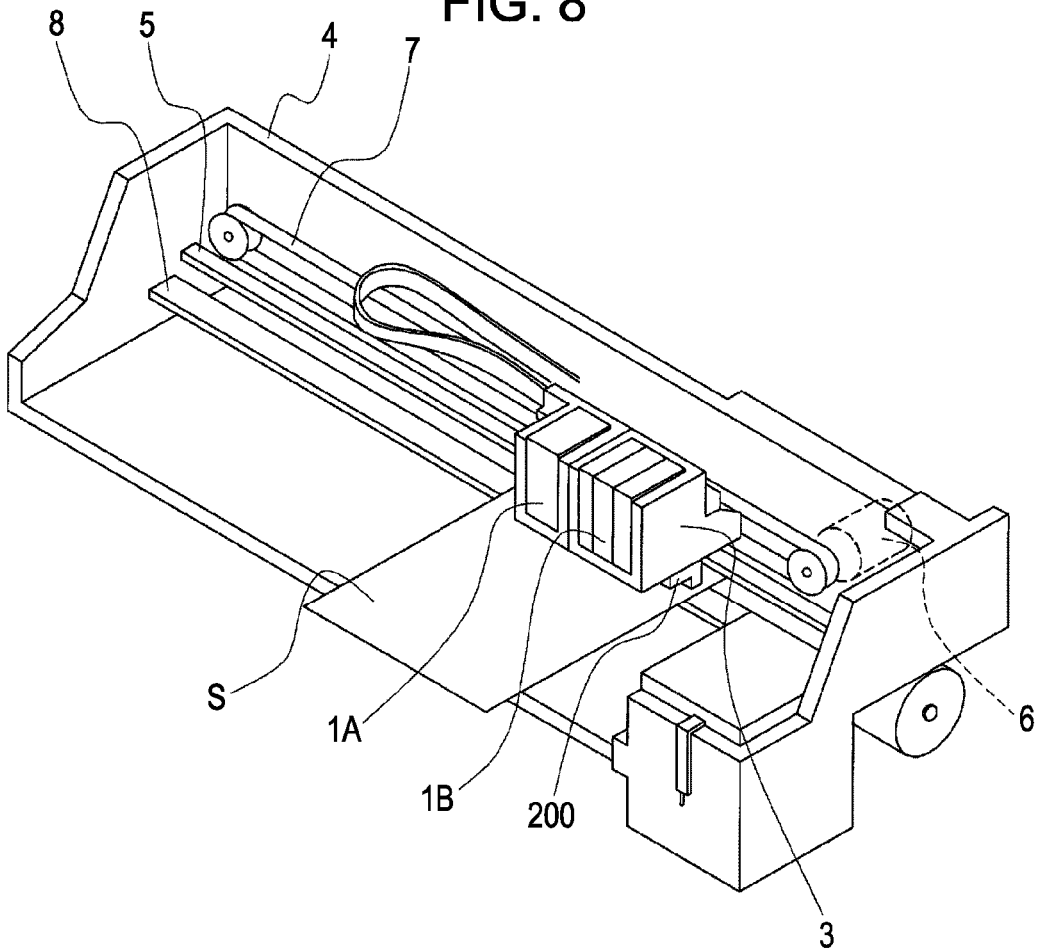
FIG. 8 is a schematic diagram that illustrates an example of a recording apparatus according to the first embodiment of the invention.

The head unit 200 that is assembled as described above is mounted on an ink-jet recording apparatus. FIG. 8 is a schematic diagram that illustrates an example of such an ink-jet recording apparatus. As illustrated in FIG. 8, ink cartridges 1A and 1B, which constitute ink-supply units, are detachably attached to the head unit 200 that is provided with ink-jet recording heads. The head unit 200 is mounted on a carriage 3. The carriage 3 is configured to move freely in the axial direction of a carriage axis 5, which is fixed to an apparatus body chassis 4. The recording head units 1A and 1B are configured to discharge, for example, black ink compound and color ink compound, respectively.

As the driving force of a driving motor 6 is communicated or transmitted to the carriage 3 by means of a plurality of gears that are not shown in the drawing and a timing belt 7, the carriage 3 on which the head unit 200 is mounted is moved along the carriage axis 5. On the other hand, a platen 8 is provided in the apparatus body chassis 4 along the carriage axis 5. A recording sheet S, which is a recording target medium (i.e., print target medium) such as a sheet of paper that is supplied by a paper feed roller that is not shown in the drawing, is transported on the platen 8.

OTHER EMBODIMENTS

Although exemplary embodiments of the invention are explained above, needless to say, the basic configuration and the scope of the invention is in no case limited to any of the above specific embodiments/examples. In the configuration of the first embodiment of the invention described above, the ink-drop discharging surfaces (nozzle plate 20) of the ink-jet recording heads 220 are bonded to the cover head 240. However, the invention is not limited to such an exemplary configuration. As an example of alternative configurations, a fixation plate may be provided between the cover head 240 and the ink-jet recording heads 220 in such a manner that the ink-drop discharging surfaces of the ink-jet recording heads 220 are bonded not directly to the cover head 240 but to the fixation plate. Needless to say, the cover head 240 may be bonded to the fixation plate.

In the configuration of the first embodiment of the invention described above, the piezoelectric layer 70 is made of lead zirconate titanate (PZT). However, the invention is not limited to such an exemplary configuration. As an example of alternative configurations, the piezoelectric layer 70 may be made of PZTS, PNN-PZT, PMN-PZT, PLZT, or the like. Any material may be used for the piezoelectric layer 70 as long as it shows asymmetrical hysteresis characteristic due to deformation attributable to mismatch in lattice constant.

In actual implementation of the invention, a water-repellent film may be formed on the ink-drop discharging surface of the nozzle plate 20 according to the first embodiment of the invention described above for the purpose of improving water-shedding property thereof. The water-repellent film may be made of, for example, a metal film though not limited thereto. Since the metal film reduces the adhesion strength of an adhesive that is used when the cover head 240 is bonded to the ink-drop discharging surface thereof, it is preferable that the water-repellent film is formed only in a region exposed by the opening portion 241 of the cover head 240. The metal film having a predetermined thickness can be formed with a high precision by, for example, eutectoid plating.

In the embodiment of the invention described above, as a typical example of a liquid ejecting head, the invention is explained while exemplifying a method of producing an ink-jet recording head unit that has a plurality of ink-jet recording heads combined with one another, where the ink-jet recording heads discharge ink as an example of a variety of liquid. Notwithstanding the foregoing, the invention is directed to various kinds of liquid ejecting heads; and therefore, needless to say, the invention is also applicable to a method of producing a variety of liquid ejecting head unit that has a plurality of liquid ejecting heads combined with one another. Liquid ejecting heads to which the invention is applicable encompass a wide variety of heads; specifically, they include without any limitation thereto: a recording head that is used in an image recording apparatus such as a printer or the like, a color material ejection head that is used in the production of color filters for a liquid crystal display device or the like, an electrode material (i.e., conductive paste) ejection head that is used for electrode formation for an organic EL display device or a surface/plane emission display device (FED, field emission display) and the like, a living organic material ejection head that is used for production of biochips.

What is claimed is:

1. A method of producing a liquid ejecting head unit that has a plurality of liquid ejecting heads, each of the plurality of liquid ejecting heads having a fluid channel formation substrate, which has pressure generation chambers that are in communication with nozzle orifices through which liquid is ejected, and piezoelectric elements, each of which is made up of a lower electrode, a piezoelectric layer that has hysteresis characteristic in a polarization electric field, and an upper electrode, formed on the fluid channel formation substrate, the liquid ejecting head unit production method comprising:
    forming the plurality of ink-jet recording heads;
    acquiring coercive electric fields of the piezoelectric layers of the liquid ejecting heads;
    specifying a range of the coercive electric field for each of a plurality of ranks;
    classifying the liquid ejecting heads into the plurality of ranks; and
    assembling the liquid ejecting heads that belong to the same rank together in the liquid head unit.

2. The method of producing a liquid ejecting head unit according to claim 1, wherein the piezoelectric layer is made of lead zirconate titanate.

3. The method of producing a liquid ejecting head unit according to claim 1, wherein the coercive electric field of the piezoelectric layer is acquired by measuring a point of polarization at which displacement of piezoelectric layer is reversed as a voltage applied to the piezoelectric layer is changed.

4. The method of producing a liquid ejecting head unit according to claim 1, wherein the plurality of ink-jet recording heads are aligned vertically to the direction of piezoelectric elements alignment.

* * * * *